US007145967B2

(12) United States Patent
Chen

(10) Patent No.: US 7,145,967 B2
(45) Date of Patent: Dec. 5, 2006

(54) SIGNAL FREQUENCY SPLITTER AND FREQUENCY SHIFT KEY DECODING APPARATUS USING THE SAME

(75) Inventor: Yung-Lung Chen, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 835 days.

(21) Appl. No.: 10/065,613

(22) Filed: Nov. 4, 2002

(65) Prior Publication Data

US 2004/0042564 A1 Mar. 4, 2004

(30) Foreign Application Priority Data

Aug. 28, 2002 (TW) .............................. 91119482 A

(51) Int. Cl.
H04L 27/14 (2006.01)
(52) U.S. Cl. ...................................... 375/334
(58) Field of Classification Search ................ 375/334; 331/34; 348/453, 726; 327/115
See application file for complete search history.

(56) References Cited

U.S. PATENT DOCUMENTS 4,777,449 A * 10/1988 O'Connor ................... 329/323

| 6,363,126 B1* | 3/2002 | Furukawa et al. .......... 375/344 |
| 6,377,315 B1* | 4/2002 | Carr et al. .................. 348/726 |
| 6,545,517 B1* | 4/2003 | Asam ......................... 327/115 |
| 6,564,039 B1* | 5/2003 | Meador et al. ............... 455/76 |
| 2002/0067191 A1* | 6/2002 | Asam ........................ 327/115 |
| 2003/0030497 A1* | 2/2003 | Duncan et al. ............... 331/34 |

FOREIGN PATENT DOCUMENTS

| JP | 08-298459 | 11/1996 |
| JP | 11-041132 | 2/1999 |

* cited by examiner

Primary Examiner—Emmanuel Bayard
Assistant Examiner—Lawrence Williams
(74) Attorney, Agent, or Firm—Jianq Chyun IP Office

(57) ABSTRACT

A frequency shift key decoding apparatus, having a frequency divider, a signal frequency splitter, and a demodulator. The signal frequency splitter has a frequency synthesizer, (n−1) first mixers, n second mixers, and n filters, where n is an integer equal to or larger than 2. The present invention can be applied to a multi-function wireless receiver that supports multiple peripherals. Since a plurality of local carrier signals is generated by only (n−1) mixers, the frequency of the local carrier signals can be randomly changed. As the mixers occupy a very small area of the integrated circuit chip, the fabrication cost is low. Further, since the mixers are easily implemented using a digital circuit, the frequency shift key decoding apparatus, and even the whole wireless receiver can be implemented in a single chip.

8 Claims, 3 Drawing Sheets

SIGNAL FREQUENCY SPLITTER AND FREQUENCY SHIFT KEY DECODING APPARATUS USING THE SAME

CROSS REFERENCE TO RELATED APPLICATIONS

This application claims the priority benefit of Taiwan application Ser. No. 9119482, filed on Aug. 28, 2002.

BACKGROUND OF INVENTION

1. Field of the Invention

The invention relates in general to a wireless communication receiving circuit using frequency shift key (FSK), and more particular, to a signal frequency splitter obtaining a plurality of local carrier signals used in frequency shift key by a frequency mixture manner and a frequency shift key decoding apparatus using the signal frequency splitter.

2. Related Art of the Invention

The conventional computer system is composed of a display, a computer host and some electrically connected peripherals. Peripherals operated by the user are restricted by the range of the computer desk. The fast development of the computer industry, plus the broad application of the Internet, has connected computers to the daily lives of many people. In addition, competition and the demand for light, thin, short and small exterior features continuously demands for the enhancement of operation speed and convenience in the industry. The industry relating to the peripherals of the computer system has developed some wireless input apparatus such as a wireless mouse, wireless keyboard, and has even convened USB interfaced peripherals into wireless peripherals. Such apparatus provides operation convenience for the user, by reducing the problems of wire connection.

If the peripherals are all converted into wireless equipment such as a wireless mouse and wireless keyboard, each piece of the equipment requires an individual wireless transmitter and an individual receiver. The extra cost is significant. Further, interference for signal transmission is inevitable. In addition, too many wireless peripherals may be problematic for integrating home appliances with the computer. Therefore, using the frequency shift key communication technique to integrate all the wireless transceivers into a single entity can offer a good resolution.

It is known in the art that the frequency shift key communication technique uses radio frequency signals with different frequencies as carriers to emit for different data. The data for different peripherals can thus be transmitted to the receiver via wireless communication simultaneously. In contrast, the receiver has to generate a plurality of corresponding local carrier signals for data signal separation and reduction. FIG. 2 shows a conventional multi-function wireless receiver supporting multiple peripherals. Referring to FIG. 2, the receiver has an oscillation crystal 134 and vibration initiator (not shown) to provide system frequency signal $F_s$ required for operation of microprocessor 136. The system frequency signal $F_s$ is supplied to a plurality of frequency synthesizers 251, 252, ..., 25n simultaneously. According to the system frequency signal $F_s$, the frequency synthesizers 251, 252, ..., 25n generate a plurality of local carrier signals $F_{b1}$, $F_{b2}$, $F_{bn}$. When the wireless receiver is operated, the low noise amplifier 124 amplifies the signal received by the antenna 122 to obtain a radio frequency signal. The mixers $M_{21}$, $M_{22}$ to $M_{2n}$ mix the radio frequency signal with the local carrier signals $F_{b1}$, $F_{b2}$ to $F_{bn}$. After being filtered by the intermediate-frequency filter 128, a plurality of intermediate-frequency signals corresponding to the data transmitted from different peripherals are obtained. As shown in FIG. 2, the frequencies of the local carrier signals $F_{b1}$, $F_{b2}$ to $F_{bn}$ in the multi-function wireless receiver that supports multiple peripherals can be randomly changed. However, the n frequency synthesizers and one oscillation crystal required for generating local carrier signals $F_{b1}$, $F_{b2}$ to $F_{bn}$ are very costly.

FIG. 3 shows another multi-function wireless receiver that supports multiple peripherals. In FIG. 3, in addition to the oscillation crystal 134 and the vibration initiator (not shown) required to generate the system frequency signal $F_s$ required for the operation of the microprocessor 136, the receiver further uses a plurality of different oscillators 351, 352, ..., 35n and vibration initiators (not shown) to generate local carrier signals $F_{b1}$, $F_{b2}$ to $F_{bn}$ used for data signal separation and frequency reduction. In the conventional receiver, (n+1) oscillation crystals and vibration initiators are used. The more peripherals to be supported, the more oscillation crystals and vibration initiators are required. Consequently, the cost is increased. Being restricted by the fixed radio frequency baseband signal, the frequency cannot be changed.

According to the above, the multi-function wireless receiver supporting multiple peripherals has the following drawbacks.

1. If the signal frequency splitter uses a plurality of frequency synthesizers to generate a plurality of local carrier signals, though the frequency of the local carrier signals can be randomly changed, the system is very costly.

2. If the signal frequency splitter uses a plurality of oscillation crystals and vibration initiators to generate a plurality of local carrier signals, the cost is high, the frequency of the local carrier signals cannot be changed, and the system flexibility is poor.

3. In the above two approaches, the restriction in cost and circuit design causes the frequency shift key decoding apparatus formed by integrating a signal frequency separation apparatus and the demodulator into a single chip to be difficult.

SUMMARY OF INVENTION

The present invention provides a signal frequency splitter and a frequency shift key decoding apparatus using the same. The frequency of the local carrier signal can be randomly changed. The fabrication cost is low. The signal frequency splitter and the frequency shift key decoding apparatus can be implemented into a signal chip using a digital circuit.

The frequency shift key decoding apparatus comprises a frequency divider, a signal frequency splitter and a demodulator. The frequency divider divides a system frequency signal $F_s$ into n−1 differential frequency signals $F_{d2}$ to $F_{dn}$. The signal frequency splitter coupled to the frequency divider generates n local carrier signals $F_{b1}$ to $F_{bn}$ according to the system frequency signal $F_s$ and the n−1 differential frequency signals $F_{d2}$ to $F_{dn}$. The signal frequency splitter receives a radio frequency signal and performs filtering after the radio frequency signal is mixed with the n local carrier signals $F_{b1}$ to $F_{bn}$ to obtain n intermediate-frequency signals. Via the demodulator coupled to the signal frequency splitter, the n radio intermediate-frequency signals are decoded to obtain n data, where "n" is an integer equal to or larger than 2.

The present invention further provides a signal frequency splitter to obtain n intermediate-frequency signals from a radio frequency signal. The signal frequency splitter comprises a frequency synthesizer, n−1 first mixers, n second mixers and n filters. "n" is an integer equal to or larger than 2. The frequency synthesizer synthesizes the local carrier signal $F_{b1}$ according to the system frequency signal $F_s$. The first mixers are denoted by $M_{12}$ to $M_{1n}$. The n−1 first mixers are all coupled to the frequency synthesizer to mix the radio frequency signal $F_{b1}$ with n−1 differential frequencies $F_{d2}$ to $F_{dn}$ to obtain n−1 local carrier signals $F_{b2}$ to $F_{bn}$ different from the local carrier signal $F_{b1}$. The second mixers denoted as $M_{21}$, $M_{22}$ to $M_{2n}$ are coupled to the frequency synthesizer and the corresponding n−1 first mixers to mix the radio frequency signal and the above local carrier signals $F_{b1}$ to $F_{bn}$, so as to obtain n intermediate-frequency mixed frequencies $F_{m1}$ to $F_{mn}$. The n filters are coupled to the respective n second mixers to filter the intermediate-frequency mixed frequencies $F_{m1}$ to $F_{mn}$ to obtain different n intermediate-frequency signals.

In one embodiment of the present invention, the frequency shift key decoding apparatus further includes a low-noise amplifier to amplify the signal received from an antenna to obtain the radio frequency signal. In addition, the radio frequency signals $F_{b1}$ to $F_{bn}$ include signals with frequencies of 26.995 MHz, 27.045 MHz and 27.095 MHz, 27.145 MHz, 27.195 MHz, and/or 27.255 MHz while the carrier frequency of the intermediate-frequency signal is 455 KHz.

In summary, the present invention comprises a signal frequency splitter to obtain a first intermediate-frequency signal and a second intermediate-frequency signal from a radio frequency signal, which further comprises a first mixer, a plurality of second mixers and a plurality of filters. The first mixer is used to mix frequencies of the first local carrier signal and the differential frequency signal to obtain the second local carrier signal. The second mixers coupled to the first mixer are used to mix the frequency of the first radio frequency with the frequency of the first local carrier signal and the frequency of the second local carrier signal to obtain the first and second intermediate-frequency frequency-mixed signals, respectively. The filters coupled to the second mixers then filter the first and second intermediate-frequency frequency-mixed signals to obtain the first and the second intermediate-frequency signals. The function of these filters is to filter the noise or interference other than the first and the second intermediate-frequency signals, so as to improve the signal to noise ratio.

In the present invention, only n−1 mixers $M_{21}$ to $M_{2n}$ are used to generate a plurality of local carrier signals $F_{b1}$ to $F_{bn}$ for separation and frequency reduction of the data signal. The mixers occupy very small area of the integrated circuit chip, such that the cost is low. Further, the mixers can be easily implemented by a digital circuit, so that the whole system, particularly the frequency shift key decoding apparatus, can be formed in a single chip.

BRIEF DESCRIPTION OF DRAWINGS

These, as well as other features of the present invention, will become more apparent upon reference to the drawings wherein.

DETAILED DESCRIPTION

Figure 1:
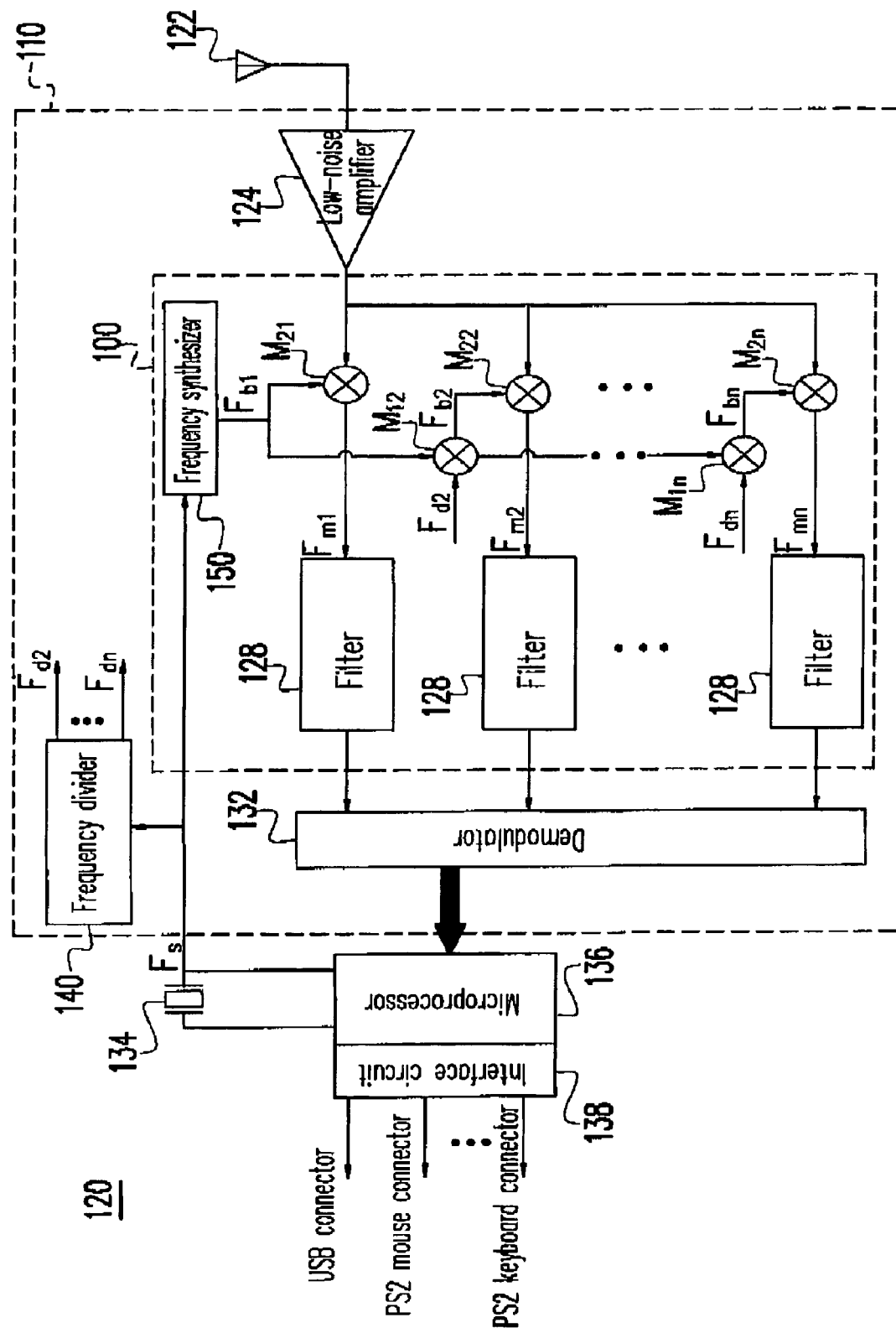
FIG. 1 shows a multi-function wireless receiver able to support multiple peripherals simultaneously according to one embodiment of the present invention.
Figure 2:
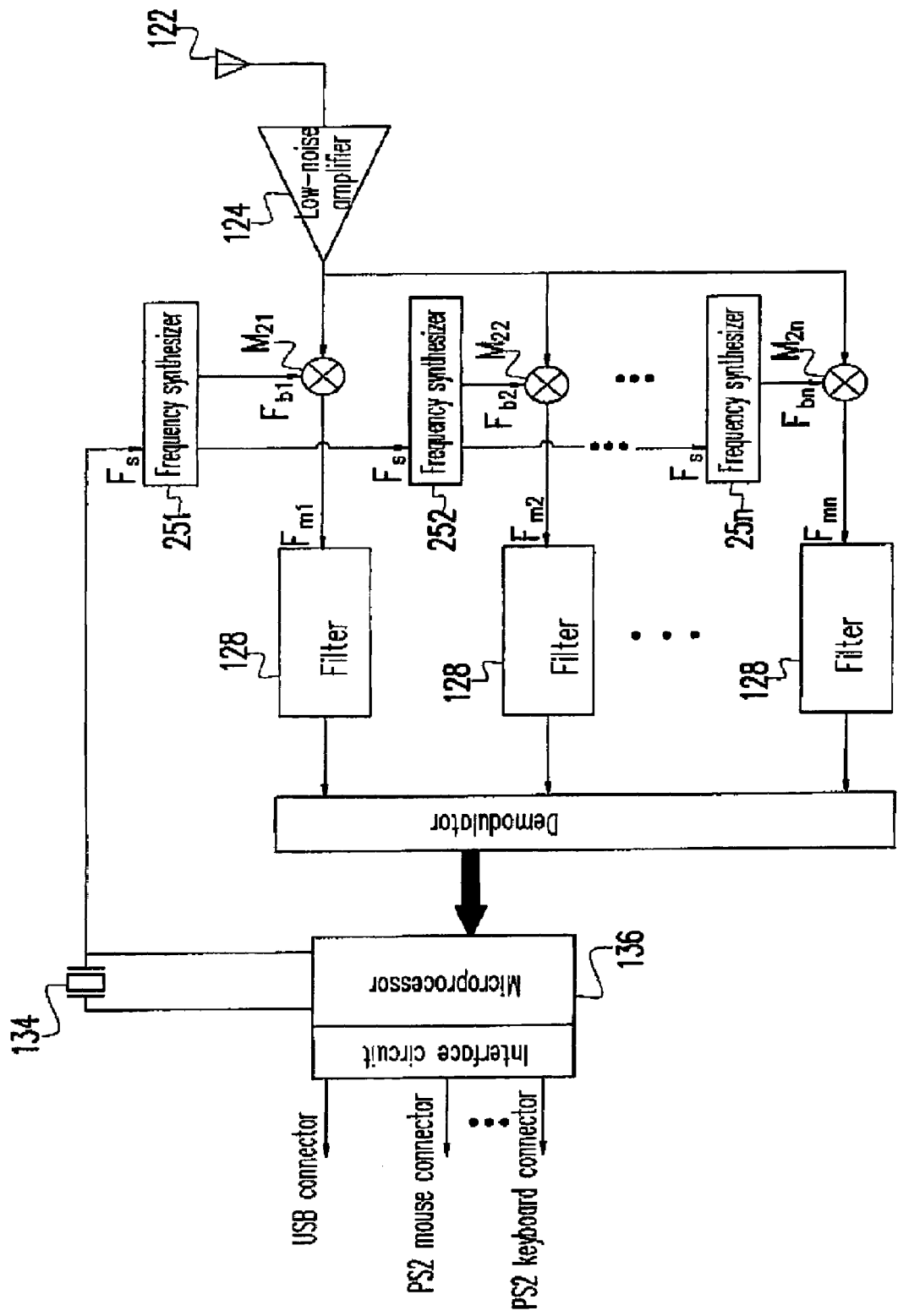
FIG. 2 shows a conventional multi-function wireless receiver to support multiple peripherals, wherein a plurality of frequency synthesizers are used to generate a plurality of local carrier signals.
Figure 3:
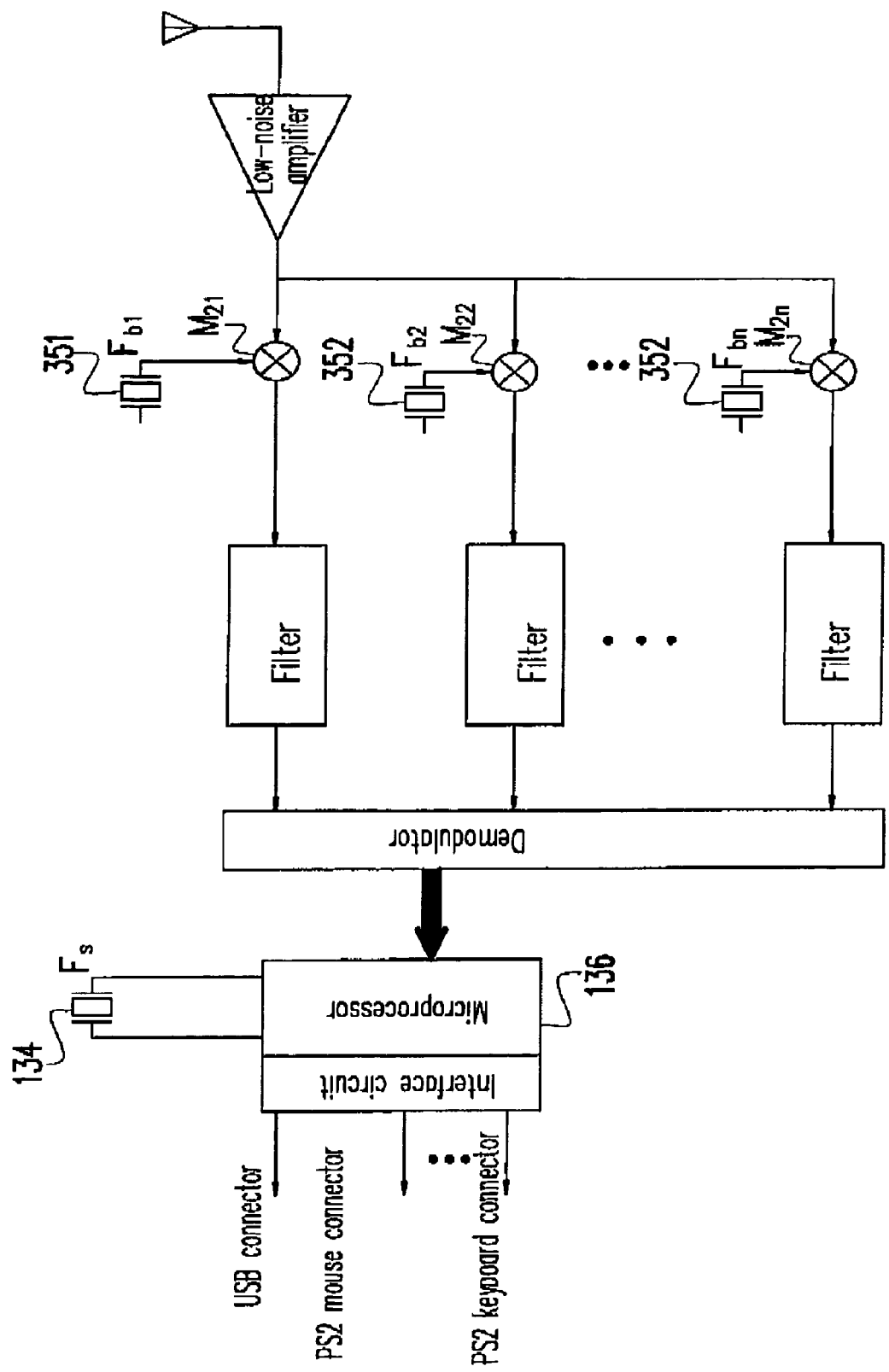
FIG. 3 shows another conventional multi-function wireless receiver to support multiple peripherals, wherein a plurality of different oscillation crystals and vibration initiators are used to generate a plurality of local carrier signals.

FIG. 1 shows a multi-function wireless receiver able to support multiple peripherals simultaneously according to one embodiment of the present invention. The related industry of the peripherals provides wireless input apparatus such as a wireless mouse, wireless keyboard, and peripheral devices originally using USB interfaces to enhance operation efficiency and convenience. These wireless peripherals use radio frequency signals with different frequencies as the carriers to transmit data with different functions in radio frequency signals to the multi-function wireless receiver 120 able to support multiple peripherals simultaneously.

The multi-function wireless receiver 120 includes an antenna 122, a microprocessor 136, an interface 138, an oscillation crystal 134, a vibration initiator (not shown), and a frequency shift key decoding apparatus 110 provided by the present invention. The frequency shift key decoding apparatus 110 includes a frequency divider 140, a low-noise amplifier 124, a signal frequency splitter 100 and a demodulator 132. The signal frequency splitter 100 provided by the present invention further comprises a frequency synthesizer 150, n−1 first mixers $M_{12}$ to $M_{1n}$, n second mixers $M_{21}$, $M_{22}$ to $M_{2n}$ and n filters 128, where "n" is a positive integer larger the 2.

In one embodiment of the present invention, the wireless receiver 120 includes only one oscillation crystal 134 and one vibration initiator (not shown) to provide the system frequency signal $F_s$ required by operation of the microprocessor 136. When the wireless receiver is operated, the antenna 122 receives a small radio frequency signal transmitted from various peripherals. After the small radio frequency signal the frequency shift key decoding apparatus 110, the signal separation and frequency reduction according to frequency shift key communication technique is performed to obtain a plurality of signals corresponding various peripherals. The signals are then decoded, such that the frequency shift key decoding apparatus 110 can output a plurality of data transmitted from various peripherals to the microprocessor 136. According to the protocol between the microprocessor 136 and the computer system, data for various peripherals are transmitted to the computer system through proper ports such as PS2 connector, mouse connector, PS2 keyboard connector and USB connector via the interface 138.

The system frequency signal $F_s$ can be provided to both the frequency divider 140 and the frequency synthesizer 150 at the, same time. Therefore, the frequency synthesizer 150 can generate the basic local carrier signal $F_{b1}$ in the wireless receiver 120 according to the system frequency signal $F_s$. The frequency divider 140 can also divides the frequency of the system frequency signal $F_s$ to obtain n−1 differential frequency signals $F_{d2}$ to $F_{dn}$. The actual frequencies of the differential frequency signals $F_{d2}$ to $F_{dn}$ are obtained by subtraction between the frequency of respective local carrier signals for respective peripheral apparatus and the frequency of the local carrier signal $F_{b1}$. For example, n−1 differential frequency signals can also be obtained by a plurality of differential frequency signals generated every 50 KHz. The low-noise amplifier 124 amplifies the small radio frequency signal received by the antenna 122 to obtain the radio frequency signal. According to the system frequency signal $F_s$ and the n−1 differential frequency signals $F_{d2}$ to $F_{dn}$ local carrier signals $F_{b1}$ to $F_{bn}$ are generated by the signal frequency splitter 100. Being received by the signal frequency reduction apparatus 100 and mixed with the n local carrier signals $F_{b1}$ to $F_{bn}$ the radio frequency signals are further filtered to obtain n intermediate-frequency signals. The n intermediate-frequency signals are decoded by the demodulator 132 to obtain n data corresponding to various peripherals.

It is known to people of ordinary skill in the art that the above low-noise amplifier 124 does not have to be included in the frequency shift key decoding apparatus 110. Instead, the low-noise amplifier 124 can be independently disposed in the wireless receiver 120. Or alternatively, the low-noise amplifier 124 can be removed from the wireless receiver 120, depending on the signal intensity and the receiving environment.

The signal frequency-reduction splitter 100 separates the radio frequency signals of various peripherals into the n intermediate-frequency signals corresponding to the peripherals. The local carrier signal $F_{b1}$ is synthesized by the frequency synthesizer 150 according to the system frequency signal $F_s$. As known to people of ordinary skill in the art, the frequency synthesizer 150 is not necessarily included in the signal frequency splitter 100, but can be disposed in the frequency shift key decoding apparatus 110 independently.

The n−1 first mixers $M_{12}$ to $M_{1n}$ are all coupled to the frequency synthesizer to mix frequencies of the local carrier signal $F_{b1}$ with the n−1 differential frequency signals $F_{d2}$ to $F_{dn}$. According to the frequency mixture theory of communication theory, the frequency-mixed signal includes a signal with the frequency difference between two signals before mixture. As the differential frequency signals $F_{2d}$ to $F_{2n}$ are obtained from subtraction between different frequencies of different radio frequency signals for different peripherals and the local carrier signal $F_{b1}$, the frequency-mixed signal includes n−1 local carrier signals $F_{b2}$ to $F_{bn}$ of the carrier frequencies used by different peripherals. The local carrier signals $F_{b2}$ to $F_{bn}$ are different from the local carrier signal $F_{b1}$.

The n second mixers $M_{21}$, $M_{22}$ to $M_{2n}$ are coupled to the corresponding frequency synthesizer and the n−1 first mixers, so that the n second mixers $M_{21}$, $M_{22}$ to $M_{2n}$ mix frequencies of the radio frequency signal and the above local carrier signals $F_{b1}$ to $F_{bn}$ Similarly, the n intermediate-frequency frequency-mixed signals $F_{m1}$ to $F_{mn}$ including data of various peripherals are obtained. The n filters 128 are coupled to respective corresponding second mixers $M_{21}$, $M_{22}$ to $M_{2n}$, such that the intermediate-frequency frequency-mixed signal $F_{m1}$ to $F_{mn}$ are filtered to remove the signals with frequency other than the mixed frequency. Consequently, n intermediate-frequency signals are obtained.

In one embodiment of the present invention, the local carrier signals $F_{b1}$ to $F_{bn}$ include signals with frequencies of 26.995 MHz, 27.045 MHz and 27.095 MHz, 27.145 MHz, 27.195 MHz, and/or 27.255 MHz, and the carrier frequency of the intermediate-frequency signal is 455 KHz.

It is known in the art that when there are only two radio frequency signals, the signal frequency splitter obtains only a first intermediate-frequency signal and a second intermediate-frequency signal from the radio frequency signals. Only one first mixer is required to mix the first radio frequency signal with the differential frequency signal to derive the second local carrier signal. The (two) second mixers coupled to the first mixer mixes the frequency of the radio frequency signal and the frequency of the first and the second local carrier signals to obtain a first and second intermediate-frequency frequency-mixed signal. Through the (two) filters coupled to the second mixers, the first and second intermediate-frequency frequency-mixed signals are filtered to obtain the first and the second intermediate-frequency signals. The function of these filters is to filter the noise or interference other than the first and the second intermediate-frequency signals, so as to improve the signal to noise ratio.

In the present invention, as the n−1 differential frequency signals $F_{d2}$ to $F_{dn}$ are obtained by dividing frequency of the system frequency signal $F_s$ via the frequency divider 140, and only n−1 mixers $M_{21}$ to $M_{2n}$ are used to generate a plurality of local carrier signals $F_{b1}$ to $F_{bn}$, the frequency of the local carrier signal can thus be changed randomly. Further, as the frequency divider 140 and the mixers occupy very small area of the integrated circuit chip compared to the conventional frequency synthesizers or the oscillation crystals and vibration initiator, the cost of the present invention is low, and the implementation is easily achieved using a digital circuit. Therefore, the frequency shift key decoding apparatus 110, or even the whole wireless receiver 120 is easily implemented on a single chip.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

The invention claimed is:

1. A signal frequency splitter to derive n intermediate-frequency signals from a radio frequency signal, the signal frequency splitter comprising:
    a frequency synthesizer, to synthesize a local carrier signal $F_{b1}$ according to a system frequency signal $F_g$;
    n−1 first mixers $M_{12}$ to $M_{1n}$ coupled to the frequency synthesizer to mix frequencies of the local carrier signal $F_{b1}$ and n−1 differential frequency signals $F_{d2}$ to $F_{dn}$, so as to obtain n−1 local carrier signals $F_{b2}$ to $F_{bn}$;
    n second mixers $M_{21}$, $M_{22}$ to $M_{2n}$ coupled to the first mixers and the frequency synthesizer to mix frequencies of the radio frequency signal and the local carrier signals $F_{b1}$, $F_{b2}$ to $F_{bn}$ to obtain n intermediate-frequency frequency-mixed signals $F_{m1}$ to $F_{mn}$; and
    n filters coupled to the second mixers to filter the n intermediate-frequency frequency-mixed signals $F_{m1}$ to $F_{mn}$ to obtain n intermediate-frequency signals;
    wherein n is a positive integer equal to or larger than 2.

2. The signal frequency splitter according to claim 1, wherein the local carrier signals $F_{b1}$ to $F_{bn}$ include signals with frequencies of 26.995 MHz, 27.045 MHz, 27.095 MHz, 27.145 MHz, 27.195 MHz, or 27.255 MHz, and a carrier frequency of the intermediate-frequency signal is about 455 KHz.

3. A signal frequency splitter, used to derive a first intermediate-frequency signal and a second intermediate-frequency signal from a radio frequency signal, the signal frequency splitter comprising:
    a first mixer, to mix frequencies of a first local carrier signal and a differential frequency signal to obtain a second local carrier signal;
    a plurality of second mixers, coupled to the first mixer to mix the frequency of the radio frequency signal with the frequencies of the first and the second local carrier signals to obtain a first and a second intermediate-frequency frequency-mixed signals, respectively; and a plurality of filters coupled to the second mixers to filter the first and second intermediate-frequency frequency-mixed signals to obtain the first and second intermediate-frequency signals.

4. The signal frequency splitter according to claim 3, wherein the frequency of the first local carrier signal is 27.045 MHz, the frequency of the second local carrier signal is 27.255 MHz, and a carrier frequency for the first and second intermediate-frequency signals is 455 KHz.

5. A frequency shift key decoding apparatus, comprising:
a frequency divider, to divide a frequency of a system frequency signal $F_g$ into a plurality of differential frequency signals $F_{d2}$ to $F_{dn}$;
a signal frequency splitter coupled to the frequency divider, to generate n local carrier signals $F_{b1}$ to $F_{bn}$ according to the system frequency signal $F_s$ and the differential frequency signals $F_{d2}$ to $F_{dn}$, the signal frequency splitter receiving a radio frequency signal and mixing the radio frequency signal with the n local carrier signals $F_{b1}$ to $F_{bn}$ into mixed signals and further filtering the mixed signals to obtain n intermediate-frequency signals; and
a demodulator, coupled to the signal frequency splitter to decode the n intermediate-frequency signals to obtain n data;
wherein n is a positive integer equal to or larger than 2.

6. The frequency shift key decoding apparatus according to claim 5, further comprising a low-noise amplifier to amplify a signal received by an antenna to obtain the radio frequency signal.

7. The frequency shift key decoding apparatus according to claim 5, wherein the signal frequency splitter comprises:
a frequency synthesizer, to synthesize a local carrier signal $F_{b1}$ according to a system frequency signal $F_g$;
n−1 first mixers $M_{12}$ to $M_{1n}$ coupled to the frequency synthesizer to mix frequencies of the local carrier signal $F_{b1}$ and n−1 differential frequency signals $F_{d2}$ to $F_{dn}$, so as to obtain n−1 local carrier signals $F_{b2}$ to $F_{bn}$;
n second mixers $M_{21}$, $M_{22}$ to $M_{2n}$ coupled to the first mixers and the frequency synthesizer to mix frequencies of the radio frequency signal and the local carder signals $F_{b1}$ to $F_{bn}$ to obtain n intermediate-frequency frequency-mixed signals $F_{m1}$ to $F_{mn}$; and
n filters coupled to the second mixers to filter the n intermediate-frequency frequency-mixed signals $F_{m1}$ to $F_{mn}$ to obtain n intermediate-frequency signals;
wherein n is a positive integer equal to or larger than 2.

8. The signal frequency splitter according to claim 5, wherein the local carrier signals $F_{b1}$ to $F_{bn}$ include signals with frequencies of 26.995 MHz, 27.045MHz, 27.095MHz, 27.145 MHz, 27.195 MHz, or 27.255 MHz, and a carrier frequency of the intermediate-frequency signal is about 455 KHz.

* * * * *